(12) United States Patent
Zhang et al.

(10) Patent No.: US 9,570,394 B1
(45) Date of Patent: Feb. 14, 2017

(54) FORMATION OF IC STRUCTURE WITH PAIR OF UNITARY METAL FINS

(71) Applicant: GLOBALFOUNDRIES INC., Grand Cayman (KY)

(72) Inventors: Xunyuan Zhang, Albany, NY (US); Nicholas V. LiCausi, Watervliet, NY (US); Errol Todd Ryan, Clifton Park, NY (US)

(73) Assignee: Globalfoundries Inc., Grand Cayman (KY)

( * ) Notice: Subject to any disclaimer, the term of this patent is extended or adjusted under 35 U.S.C. 154(b) by 0 days.

(21) Appl. No.: 15/140,808

(22) Filed: Apr. 28, 2016

(51) Int. Cl.
| | |
|---|---|
| *H01L 21/4763* | (2006.01) |
| *H01L 23/528* | (2006.01) |
| *H01L 21/768* | (2006.01) |
| *H01L 21/02* | (2006.01) |
| *H01L 21/285* | (2006.01) |
| *H01L 21/288* | (2006.01) |
| *H01L 21/3205* | (2006.01) |
| *H01L 23/522* | (2006.01) |
| *H01L 23/532* | (2006.01) |

(52) U.S. Cl.
CPC ..... *H01L 23/5283* (2013.01); *H01L 21/02123* (2013.01); *H01L 21/02164* (2013.01); *H01L 21/288* (2013.01); *H01L 21/28556* (2013.01); *H01L 21/28568* (2013.01); *H01L 21/32051* (2013.01); *H01L 21/7684* (2013.01); *H01L 21/76852* (2013.01); *H01L 21/76877* (2013.01); *H01L 23/5226* (2013.01); *H01L 23/53209* (2013.01); *H01L 23/53228* (2013.01); *H01L 23/53242* (2013.01); *H01L 23/53257* (2013.01)

(58) Field of Classification Search
CPC ........... H01L 29/66545; H01L 23/5226; H01L 21/76831; H01L 21/7684; H01L 21/76802; H01L 21/76805
USPC ......... 438/629, 631, 672, 675; 257/750, 758
See application file for complete search history.

(56) References Cited

U.S. PATENT DOCUMENTS 9,190,323 B2   11/2015  Zhang et al.
9,209,197 B2 *  12/2015  Ramsbey .......... H01L 29/42328
(Continued)

OTHER PUBLICATIONS

Lecohier et al., "Selective low pressure chemical vapor deposition of copper and platinum," Journal of Vacuum Science & Technology B 10:262-7 (1992).

(Continued)

*Primary Examiner* — Sheila V. Clark
(74) *Attorney, Agent, or Firm* — Ernest G. Cusick; Hoffman Warnick LLC (57) ABSTRACT

Embodiments of the present disclosure may provide methods of forming an IC structure with a pair of metal fins. An IC structure with a pair of metal fins can include two unitary metal fins positioned on a substrate and each including an elongated wire positioned on the substrate and a via positioned directly on a portion of the elongated wire, the elongated wire and the via of each unitary metal fin defining an inverted T-shape, wherein each unitary metal fin includes the elongated wire with a pair of opposing sidewalls substantially coplanar with a pair of opposing sidewalls of the via, and wherein the each unitary metal fin includes a single crystallographic orientation. An insulating layer can be positioned directly laterally between the two unitary metal fins.

20 Claims, 6 Drawing Sheets

(56) References Cited

U.S. PATENT DOCUMENTS

| | | | | |
|---|---|---|---|---|
| 2006/0292889 A1* | 12/2006 | Blanchard | .............. | B82Y 10/00 |
| | | | | 438/761 |
| 2013/0105948 A1* | 5/2013 | Kewley | ............... | H01L 21/0337 |
| | | | | 257/618 |
| 2014/0167128 A1* | 6/2014 | Ramsbey | .......... | H01L 29/42328 |
| | | | | 257/314 |
| 2015/0194496 A1* | 7/2015 | Basker | .............. | H01L 29/66795 |
| | | | | 257/192 |

OTHER PUBLICATIONS

Vidal et al., "Fabrication of fine copper lines by selective chemical vapor deposition on silicon substrates," Microelectronic Engineering. 55:285-90 (2001).

\* cited by examiner

FORMATION OF IC STRUCTURE WITH PAIR OF UNITARY METAL FINS

BACKGROUND

Technical Field

The present disclosure relates to integrated circuits (ICs) incorporating semiconductor materials, and more specifically, to IC structures which includes a pair of metal fins and methods of forming the same. Each metal fin can be a unitary structure which functions as both a metal wire and a via during operation, and processes of forming the pair of metal fins can reduce a lateral separation distance between metal wires and vias in an IC.

Related Art

Each IC can be made up of billions of interconnected devices, such as transistors, resistors, capacitors, and diodes, located on one or more chips of semiconductor substrate material. The quality and viability of a product including an IC can be at least partially dependent on the techniques used for fabricating the IC and the structure of various components therein. Fabrication of an IC can include two phases: front-end-of-line processes (FEOL) and back-end-of-line processes (BEOL). FEOL generally includes fabrication processes performed on a wafer up to and including the formation of a first "metal level," i.e., a metal wire for connecting several semiconductor devices together. BEOL generally includes fabrication processes following the formation of the first metal level, including the formation of all subsequent metal levels. Each metal level can include metal wires therein, which can be connected to other metal levels through vertically-oriented conducting wires known as vias. In conventional BEOL processing, a layer of vias is formed to connected devices in an IC structure to a layer of metal wires formed on top of the vias, with a successive layer of vias formed thereon, followed by another layer of meal wires, etc. To provide greater scaling and sophistication of the fabricated device, the number of metal levels can be varied to suit a particular application, e.g., by providing four to six metal levels, or as many as, in a further example, sixteen or more metal levels. Among other physical characteristics, the specific methodologies used during BEOL can define a resulting "pitch" of components in the IC.

Pitch is a quantity which measures the periodic distance of two features. A value of pitch specifies a sum of the width of a feature (e.g., a transistor gate) and the space on one side of the feature separating that feature from a neighboring feature. Depending on the photolithographic process being used, factors such as optics and wavelengths of light or radiation restrict how small the pitch can be before features can no longer be reliably printed to a wafer or mask. As such, the pitch limits the smallest size of any features that can be created on a wafer. Various changes and improvements to IC fabrication, over time, have accommodated progressive reductions in pitch to provide greater component densities and greater operational sophistication in an IC product.

SUMMARY

A first aspect of the disclosure provides a method of forming an integrated circuit (IC) structure, the method including: providing a freestanding dummy structure positioned on a substrate, the freestanding dummy structure including: a first metal positioned on the substrate, and a mask positioned on the first metal; forming an insulating layer on the substrate, wherein the insulating layer laterally abuts the mask of the freestanding dummy structure; forming an opening in the mask to expose an upper surface of the first metal; forming a second metal on the first metal and within the opening; removing the insulating layer to expose a pair of opposing sidewalls of the first and second metals; selectively growing a third metal on the exposed pair of opposing sidewalls of the first and second metals, such that the third metal is positioned on the substrate and directly laterally abuts the first and second metals; planarizing an upper surface of the third metal to expose the mask and the second metal; and removing the first metal, the second metal, and the mask to yield a pair of unitary metal fins positioned on the substrate, wherein each of the pair of unitary metal fins includes a remaining portion of the third metal.

A second aspect of the disclosure provides a method of forming a set of wires and contacts for an integrated circuit (IC), the method including: providing a freestanding dummy structure positioned on a substrate, the freestanding dummy structure including: a first metal positioned on the substrate, and a mask positioned on the first metal, wherein the first metal comprises tungsten (W); forming an insulating layer on the substrate, wherein the insulating layer laterally abuts the mask; forming an opening in the mask to expose an upper surface of the first metal; epitaxially growing a second metal selectively on the first metal and within the opening, wherein the second metal comprises tungsten (W); removing the insulating layer to expose a pair of opposing sidewalls of the first and second metals; selectively growing a third metal on the exposed pair of opposing sidewalls of the first and second metals, such that the third metal is positioned on the substrate and laterally abuts the first and second metals; planarizing an upper surface of the third metal to expose the mask and the second metal; and removing the first metal, the second metal, and the mask to yield a pair of unitary metal fins positioned on the substrate, wherein each of the pair of unitary metal fins includes a remaining portion of the third metal.

A third aspect of the disclosure provides an integrated circuit (IC) structure comprising: a first unitary metal fin positioned on a substrate and including a first elongated wire positioned on the substrate and a first via positioned directly on a portion of the first elongated wire, the first elongated wire and the first via of the first unitary metal fin defining an inverted T-shape, wherein the first elongated wire includes a pair of opposing sidewalls substantially coplanar with a pair of opposing sidewalls of the first via, and wherein the first unitary metal fin includes a single crystallographic orientation; a second unitary metal fin positioned on the substrate and including a second elongated wire positioned on the substrate and a second via positioned directly on a portion of the second elongated wire, the second elongated wire and the second via of the second unitary metal fin defining an inverted T-shape, wherein the second elongated wire includes a pair of opposing sidewalls substantially coplanar with a pair of opposing sidewalls of the second via, and wherein the second unitary metal fin includes a single crystallographic orientation; and an insulator positioned directly laterally between the first unitary metal fin and the second unitary metal fin, wherein a lateral width of the insulator between the first and second unitary metal fins is between approximately five nanometers (nm) and approximately twenty nm.

BRIEF DESCRIPTION OF THE DRAWINGS

The embodiments of this disclosure will be described in detail, with reference to the following figures, wherein like designations denote like elements, and wherein.

It is noted that the drawings of the disclosure are not to scale. The drawings are intended to depict only typical aspects of the disclosure, and therefore should not be considered as limiting the scope of the disclosure. In the drawings, like numbering represents like elements between the drawings.

DETAILED DESCRIPTION

In the following description, reference is made to the accompanying drawings that form a part thereof, and in which is shown by way of illustration specific exemplary embodiments in which the present teachings may be practiced. These embodiments are described in sufficient detail to enable those skilled in the art to practice the present teachings and it is to be understood that other embodiments may be used and that changes may be made without departing from the scope of the present teachings. The following description is, therefore, merely exemplary.

The present disclosure relates to integrated circuit (IC) structures which include a pair of metal fins therein and methods of forming the same. Among other things, embodiments of the present disclosure can provide a structure and fabrication technique for providing a pair of unitary metal fins positioned on the substrate. During operation of a product incorporating the IC structure, the unitary metal fins can serve the dual function of a metal wire and a via for connecting the metal wire to another electrically conductive component of the IC structure. The metal fins can be formed as a pair of laterally separated metal fins by selectively growing a conductive metal on exposed sidewalls of two metals of a dummy structure (e.g., by epitaxy). Forming the metal fins according to this process can yield, e.g., metal fins with a reduced pitch relative to one another. In particular, embodiments of the present disclosure are operable to provide a lateral separation distance between adjacent metal fins that is between approximately five nanometers (nm) and approximately twenty nm.

Figure 1:
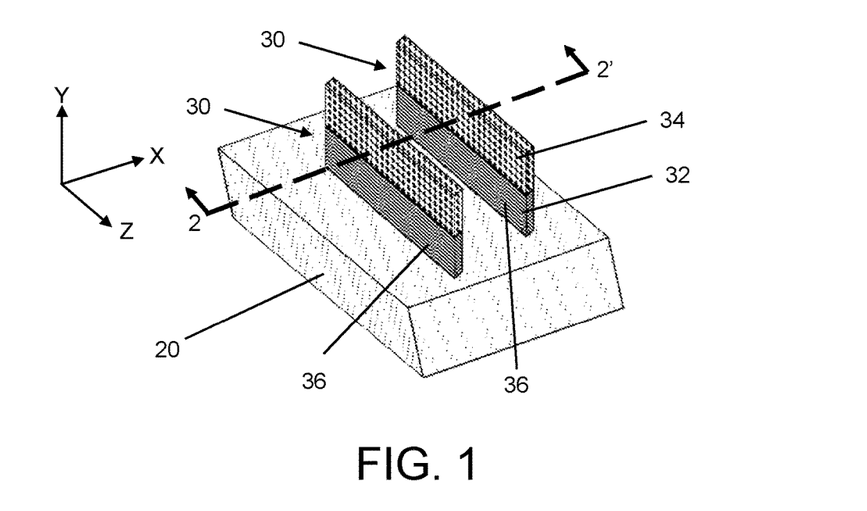
FIG. 1 shows a perspective view of two freestanding dummy structures according to embodiments of the present disclosure.

Referring to FIG. 1, a perspective view of a first process in a method of forming an IC structure according to embodiments of the disclosure is illustrated. Methods according to the present disclosure can include providing and/or forming structures on a substrate 20 of semiconductor material. Substrate 20 may be provided, e.g., as a bulk semiconductor substrate and/or a semiconductor on insulator (SOI) layer with insulating material thereunder. For the purposes of example and simplicity, other materials and/or layers positioned beneath substrate 20 have been omitted from the accompanying figures. Substrate 20 may include, e.g., silicon, germanium, silicon germanium, silicon carbide, and other materials consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other materials suitable for the composition of substrate 20 can include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). Furthermore, a portion or entire substrate 20 may be strained. In addition or alternatively, substrate 20 may be provided in the form of a material other than a semiconductor material. For example, substrate 20 may be composed of one or more electrically insulating materials (e.g., one or more dielectric materials described elsewhere herein) in processes of forming IC structures positioned on and connected to other metal levels.

Substrate 20 can include one or more freestanding dummy structures 30 positioned thereon. Although two freestanding dummy structures 30 are shown in the accompanying figures as an example to illustrate the scalability of methods described herein, it is understood that any desired number of freestanding dummy structures 30 can be provided and processed according to embodiments of the present disclosure. Alternatively, only one dummy structure 30 can be provided and processed according to embodiments of the present disclosure. Each dummy structure 30 can include a first metal 32 positioned on substrate 20, in addition to a mask 34 positioned on an upper surface of first metal 32. Freestanding dummy structures 30 can be fabricated, e.g., by providing or forming a layer of first metal 32 on substrate 20 and a layer of mask 34 on first metal 32, and then patterning and removing undesired areas of first metal 32 and mask 34 to expose an upper surface of substrate 20. The remaining portion(s) of first metal 32 and mask 34 can protrude from an upper surface of substrate 20 to form freestanding dummy structures 30. Thus, the term "freestanding" as used herein generally describes a structure, which may include several materials therein, which does not laterally abut another structure positioned on substrate 20. Freestanding structure 30 can also be formed by one or more alternative techniques, e.g., forming a trench within a bulk layer of semiconductor material, forming first metal 32 and mask 34 successively in the trench, and etching the bulk semiconductor material to form substrate 20 with freestanding dummy structure(s) 30 thereon. Any other currently-known or later-developed process of forming a freestanding layered structure on substrate 20 may also be used.

First metal 32 can include one or more metals which can be formed, e.g., by deposition and patterning. As used herein, the term "deposition" generally refers to any currently known or later developed technique appropriate for first metal 32 or other materials to be deposited including but not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, and/or evaporation. First metal can be formed with a composition which includes one or more transition metals (e.g., any metal included in groups three through twelve of the periodic table, e.g., cobalt, nickel, copper, platinum, gold, etc.), and in some embodiments may be partially or completely composed of tungsten (W). As discussed elsewhere herein, first metal 32 can be formed, e.g., as a bulk layer on substrate 20 before being patterned and removed to form freestanding dummy structure 30.

Mask 34 can be positioned directly on first metal 32 such that the upper surface of first metal 32 in freestanding dummy structure 30 is completely covered by mask 34. Mask 34 can be composed of any material which can be selectively removed (e.g., by etching in a subsequent process stage), yet prevents additional materials from being formed by epitaxy on underlying surfaces covered by mask 34. Mask 34 can be provided in the form of, e.g., a hard (i.e., non-polymer or organic) mask such as a silicon nitride compound ($Si_3N_4$) or another nitride material. The composition of mask 34 can also include one or more materials conventionally used as a "hard mask" in IC fabrication, e.g., titanium (Ti), silicon oxide ($SiO_2$), and titanium nitride (TiN). Mask 34 can thereby define an uppermost layer or surface of freestanding dummy structure 30, while allowing opposing sidewalls 36 of first metal 32 to remain exposed.

Figure 2:
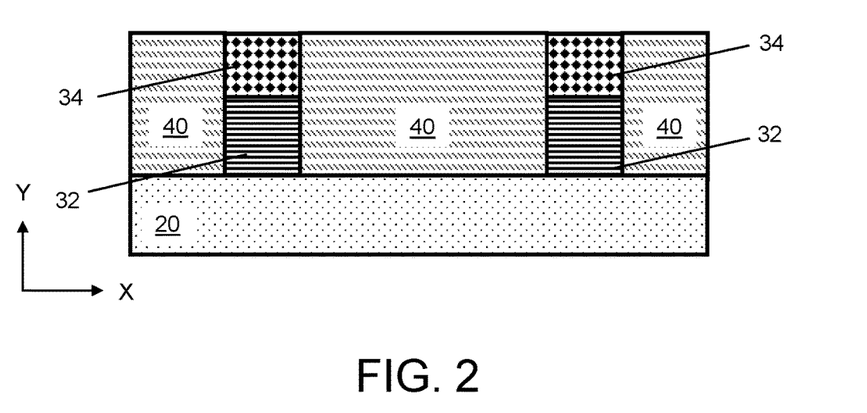
FIG. 2 shows a cross-sectional view of two dummy structures and an insulating layer positioned on a substrate according to embodiments of the present disclosure.

Turning to FIG. 2, a cross-sectional view along line 2-2' (FIG. 1) in plane X-Y illustrating substrate 20, first metal 32, and mask 34 is shown. In addition to the structures illustrated in FIG. 1, embodiments of the present disclosure can include forming an insulating layer 40 on substrate 20. Insulating layer 40 can be formed on substrate 20, e.g., by deposition and/or any other currently known or later developed process of forming an insulating material on a substrate or other layer. The formed insulating layer 40 can directly laterally abut first metal 32 and mask 34. After being formed, an upper surface of insulating layer 40 can be planarized, e.g., via chemical mechanical polishing (CMP) such that an upper surface of insulating layer 40 is substantially coplanar with an upper surface of mask 34. Insulating layer 40 can be composed of, for example, silicon oxide ($SiO_2$) or amorphous silicon. Other insulator materials used for insulator layer 40 can include, e.g., silicon nitride ($Si_3N_4$), fluorinated $SiO_2$ (FSG), hydrogenated silicon oxycarbide (SiCOH), porous SiCOH, boro-phospho-silicate glass (BPSG), silsesquioxanes, near frictionless carbon (NFC), carbon (C) doped oxides (i.e., organosilicates) that include atoms of silicon (Si), carbon (C), oxygen (O), and/or hydrogen (H), thermosetting polyarylene ethers, SiLK (a polyarylene ether available from Dow Chemical Corporation), a spin-on silicon-carbon containing polymer material available from JSR Corporation, other low dielectric constant (<3.9) material, or layers thereof. As noted elsewhere herein, one or more of the same materials used to form insulating layer 40 can be used to form other similar layers of electrically insulating material.

Figure 3:
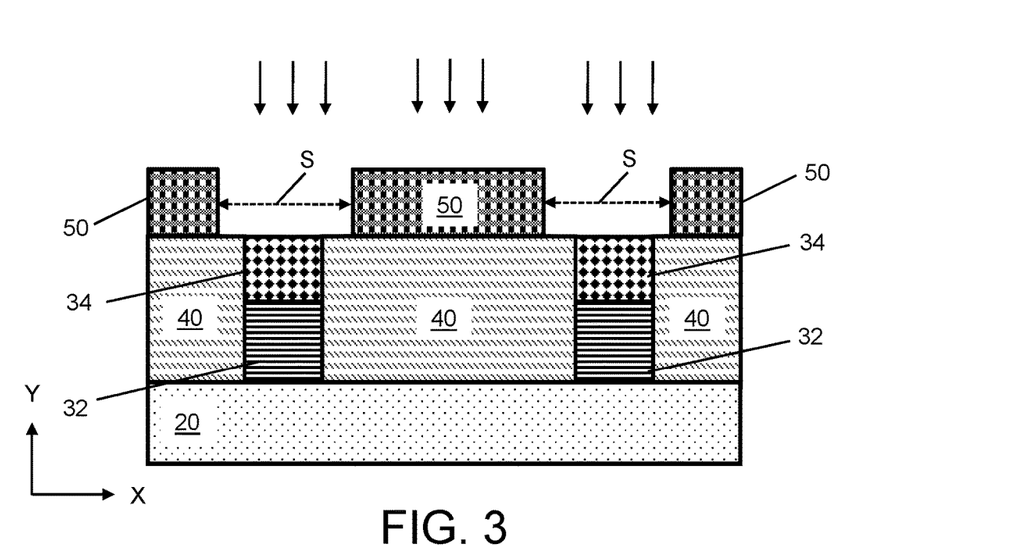
FIGS. 3-4 show cross-sectional views of forming an opening in a mask to expose the upper surface a first metal according to embodiments of the present disclosure.

Turning to FIG. 3, a portion of mask 34 can be removed in further processes according to the present disclosure. To target a specific portion of mask 34 for removal, embodiments of the present disclosure can include forming a lithographic mask 50 on an upper surface of insulating layer 40 (e.g., by deposition thereon) such that a portion of mask 34 is exposed at its upper surface. Lithographic mask 50 can include openings S, each of which can have a cross-sectional area at least as large as a cross-sectional area of mask 34 at a targeted portion thereof. Alternatively, openings S may have a larger cross-sectional area than a targeted portion of mask 34, such that an upper portion of insulating layer 40 is exposed. In this case, embodiments of the present disclosure can include using a nitride-selective etchant in subsequent process steps to prevent etching of insulating layer 40. Lithographic mask 50 can include, e.g., one or more organic materials or may include alternative hard mask materials such as titanium nitride (TiN), titanium oxide ($TiO_2$), other oxide-like or other nitride-like materials.

Figure 4:
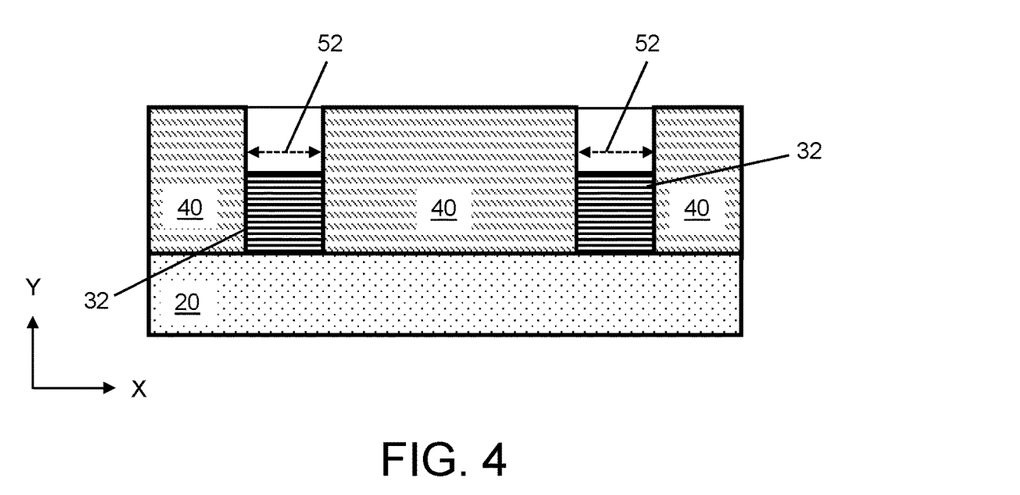

Referring to FIGS. 3 and 4 together, embodiments of the present disclosure can include forming an opening 52 in mask 34, thereby exposing an upper surface of first metal 32. Openings 52 may be formed, e.g., by etching. Etching generally refers to the removal of material from a substrate (or structures formed on the substrate), and is often performed with a mask (e.g., lithography mask 50) in place so that material may selectively be removed from certain areas of the substrate, while leaving the material unaffected, in other areas of the substrate. There are generally two categories of etching, (i) wet etch, and (ii) dry etch. Wet etch is performed with a solvent (such as an acid or a base) which may be chosen for its ability to selectively dissolve a given material (such as oxide), while, leaving another material (such as polysilicon or nitride) relatively intact. This ability to selectively etch given materials is fundamental to many semiconductor fabrication processes. A wet etch will generally etch a homogeneous material (e.g., nitride) isotopically, but a wet etch may also etch single-crystal materials (e.g. silicon wafers) anisotopically. Dry etch may be performed using a plasma. Plasma systems can operate in several modes by adjusting the parameters of the plasma. Ordinary plasma etching produces energetic free radicals, neutrally charged, that react at the surface of the wafer. Since neutral particles attack the wafer from all angles, this process is isotopic. Ion milling, or sputter etching, bombards the wafer with energetic ions of noble gases which approach the wafer approximately from one direction, and therefore this process is highly anisotopic. Reactive-ion etching (RIE) operates under conditions intermediate between sputter and plasma etching and may be used to produce deep, narrow features, such as STI trenches. For example, as depicted in FIG. 3, methods according to the present disclosure can include using a wet etch (depicted with arrows in FIG. 3 only) to target and remove exposed portions of mask 34 while leaving insulating layer 40 intact. Although forming openings 52 will yield a vacant area above first metal 32, it is understood that a remaining portion of mask 34 may be left intact and can be present, e.g., in other cross-sections positioned laterally behind or in front of the cross-section depicted in FIG. 4 (i.e., into or out of the plane of the page).

Figure 5:
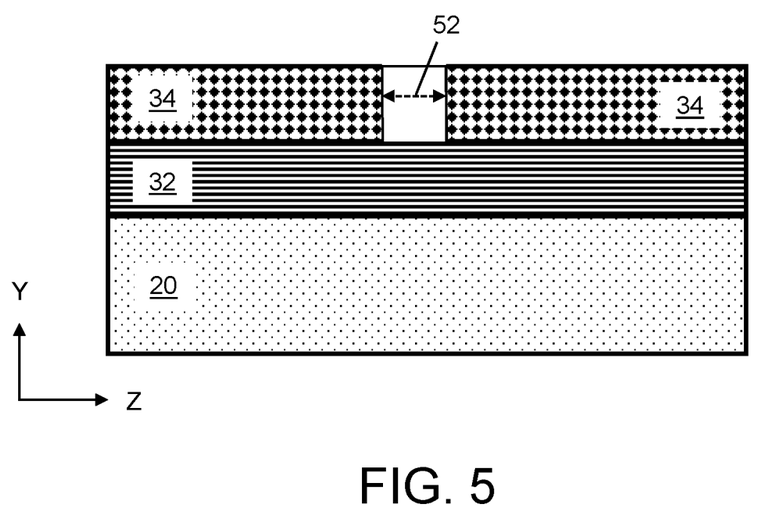
FIG. 5-6 show a cross-sectional views of forming a second metal in an opening of a mask according to embodiments of the present disclosure.
Figure 6:
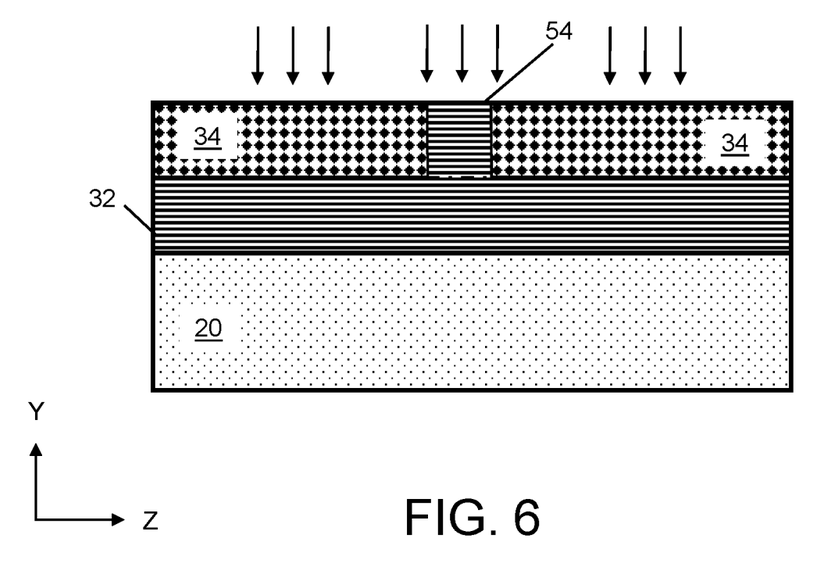

Referring to FIGS. 5 and 6 together, processes of forming a second metal 54 (FIG. 6 only) within openings(s) 52 (FIG. 5 only) are shown. As illustrated, in the view of plane Z-Y, a remaining portion of mask 34 can remain intact on an upper surface of first metal 32. Insulating layer 40 (FIGS. 3-4), formed in preceding steps, can remain intact in a distal Z-Y plane to that depicted in FIGS. 5-6 to form two sidewalls of opening(s) 52. Insulating layer 40 is omitted from FIGS. 5-6 to further clarify the process of filling opening(s) 52. To form the shape of conductive structures formed on substrate 20 in subsequent process steps, a second metal 54 can be formed within opening 52, e.g., by selective deposition and/or non-selective deposition (denoted by arrows in FIG. 6) followed by planarization. In an embodiment, second metal 54 can be epitaxially grown on an upper surface of first metal 32 exposed in opening 52, e.g., an epitaxy-based CVD process for growing metal on metal. "Epitaxy" or "epitaxial growth," as used herein, refers to a process by which a thin layer of single-crystal or large-grain polycrystalline material is deposited on a base material with similar crystalline properties. In the case of second metal 54, first metal 32 can act as a seed layer for epitaxial growth of second metal 54 thereon. Epitaxial growth can occur in such a way that the crystallographic structure of the underlying substrate becomes reproduced in the epitaxially grown material. In some cases, epitaxial growth can be implemented by means of a chemical vapor deposition (CVD). That is, a chemical reaction in the gas-phase which produces a solid material to be deposited on an exposed material. Epitaxy by deposition generally can be performed at temperatures above one thousand degrees Celsius (° C.), but it is understood that lower temperatures can be used in modified forms of this process.

Second metal 54 may be composed of a conductive metal such as one or more of the example materials described elsewhere herein relative to first metal 32. More specifically, second metal 54 can have the same material composition as first metal 32, e.g., by forming first metal 32 and second metal 54 from tungsten (W). The composition of second metal 54 can be selected such that the material interface between first metal 32 and second metal 54 is free of intervening materials and/or contaminants therebetween. Due to the removal of first and second metals 32, 54 from a resulting structure as described elsewhere herein, second metal 54 can be formed within opening(s) 52 without forming a refractory metal liner on the upper surface of first metal 32 and mask 34. As illustrated in FIG. 6, first and second metals 32, 54 can take on an inverted T-shape because only a portion of mask 34 has been removed to form opening(s) 52. As used herein, the term "inverted t-shape" can include any figure having a two dimensional profile including a lower rectangle with a greater lateral width than an upper rectangle positioned on the lower rectangle. In embodiments of the present disclosure, the lateral width of first metal 32 along Z-axis can be greater than the lateral width of second metal 54 along Z-axis. As such, the term "inverted T-shape" as used herein can also include, e.g., substantially L-shaped geometries where applicable. Opening(s) 52 and second metal 54 need not be positioned on a lateral midpoint of first metal 32, and can be positioned on any desired upper surface of first metal 32 to form the inverted T-shape.

Figure 7:
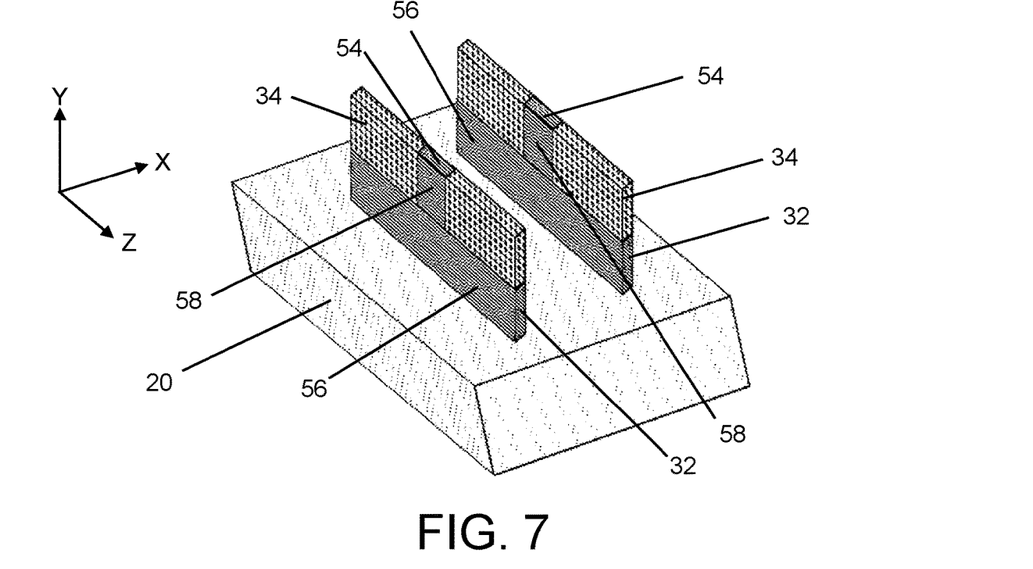
FIG. 7 shows a perspective view of two first metals each with a second metal and mask thereon according to embodiments of the present disclosure.

Turning to FIG. 7, insulating layer 40 (FIGS. 2-3) can be removed from substrate 20 such that first metal 32, mask 34, and second metal 54 remain freestanding on substrate 20 without other structures being positioned laterally therebetween. The removing of insulating layer 40 can be implemented using a non-selective etchant, an etchant selective to insulating materials (e.g., oxide materials), or any other currently known or later developed process for removing an insulating layer from a structure. In an example embodiment, insulating layer 40 can be removed from substrate 20 by using a diluted hydrofluoric acid (dHF) to break down and remove insulating layer 40 (composed, e.g., of silicon oxide) while leaving first metal 32, mask 34 (composed, e.g., of a nitride compound) and second metal 54 intact. The lateral width of the freestanding remainder of first metal 32, mask 34, and second metal 54 along axis X can define a lateral separation between structures formed in other process steps after first metal 32, mask 34, and second metal 54 are removed as described herein. As shown in FIG. 7, first metal 32 and second metal 54 being positioned on substrate 20 can expose a pair of lateral sidewalls 56 of first metal 34 and a pair of lateral sidewalls 58 of second metal 54. Sidewalls 56, 58 can form an inverted T-shape. Only one of each pair of exposed lateral sidewalls 56, 58 is visible in the perspective view of FIG. 7.

Figure 8:
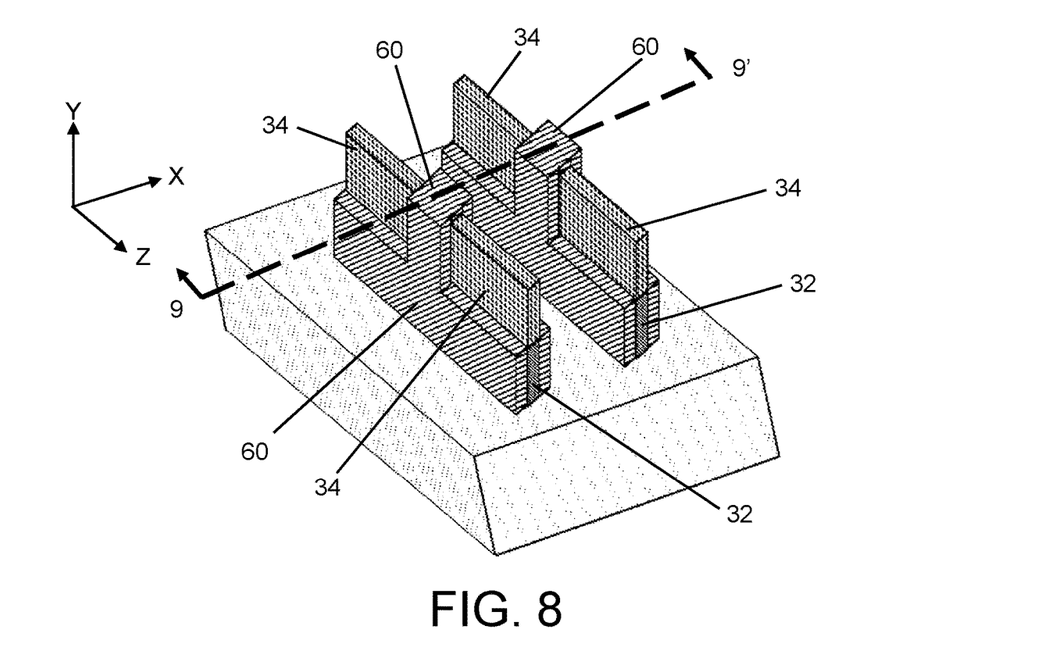
FIG. 8 shows a perspective view of two third metals grown on the first and second metals according to embodiments of the present disclosure.

Turning to FIG. 8, embodiments of the present disclosure can include forming additional materials on exposed pairs of lateral sidewalls 56, 58 (FIG. 7) of first and second metals 32, 54. In particular, a third metal 60 can be formed selectively on exposed surfaces (i.e., exposed lateral sidewalls 56, 58) of first and second metals 32, 54 without being formed on the remaining portions of mask 34. Third metal 60 can include one or more materials conventionally used in the composition of a metal wire or via in an IC structure, and as examples can include copper (Cu), ruthenium (Ru), cobalt (Co), molybdenum (Mo), iridium (Ir), osmium (Os), niobium (Nb) and/or nickel (Ni). Third metal 60 can include a single metallic substance and/or a combination of metallic substances, and in some embodiments may include dopant materials therein (e.g., germanium (Ge), boron (B), phosphorus (P), antimony (Sb), etc. Third metal 60 can be formed selectively on first and second metals 32, 54, e.g., by deposition using CVD, ALD, or other selective deposition processes. Where first and second metals 32, 54 include tungsten (W), the composition of third metal 60 and the process of forming third metal 60 can be selected such that third metal 60 grows on the exposed tungsten without growing on mask 34. The entirety of third metal 60 can have a single crystallographic orientation or large-grain polycrystalline orientation as a result of being formed in a single epitaxial growth on first and second metals 32, 54. Although third metal 60 is positioned directly on an upper surface of substrate 20 after being formed, selective growth of third metal 60 on first and second metals 32, 54 on exposed lateral sidewalls 56, 58 will not cause third metal 60 to grow epitaxially on substrate 20. After being formed, third metal 60 can laterally abut first and second metals 32, 54 positioned on substrate 20.

Figure 9:
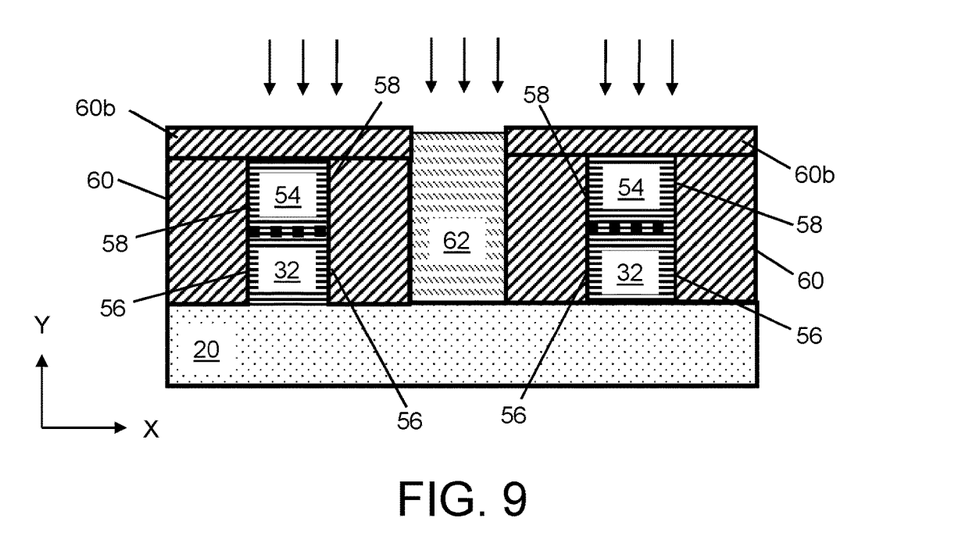
FIGS. 9-10 show cross-sectional views of planarizing an upper surface of the third metal and insulating layer according to embodiments of the present disclosure.
Figure 10:
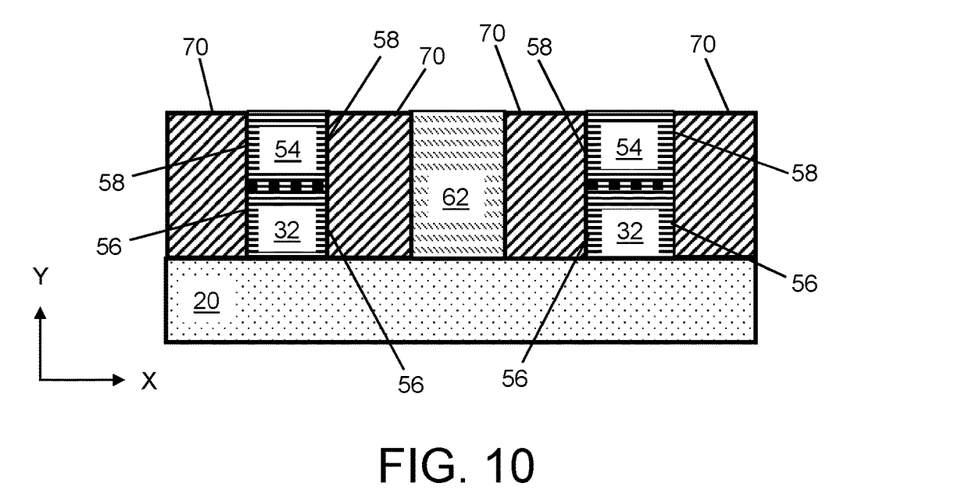

Turning to FIGS. 9-10, embodiments of the present disclosure can include further processing of third metal 60 into separate structures. FIG. 9 shows a cross-section in plane X-Y along line 9-9' (FIG. 8) of first, second, and third metal 32, 54, 60 on substrate 20. Phantom lines are shown in FIG. 9 to denote first and second metals 32, 54, but it is understood that first and second metals 32, 54 may be a unitary structure as a result of forming second metal 54 by epitaxial growth. In addition, each pair of lateral sidewalls 56, 58 of first and second metals 32, 54, is positioned laterally adjacent to third metal 60. After third metal 60 is formed, embodiments of the present disclosure can include forming a dummy insulator layer 62 (as denoted by arrows in FIG. 9) on substrate 20 to provide electrical insulation between devices thereon. Dummy insulator layer 62 can include one or more insulating materials described elsewhere herein as examples of insulating layer 40 (FIGS. 2-4). Dummy insulator layer 62 can be formed selectively or non-selectively on substrate 20 by using the same processes described elsewhere herein for forming insulating layer 40 adjacent to freestanding dummy structure(s) 30 (FIG. 1).

After being formed, an upper portion 60b of third metal 60 can cover and extend laterally over top of second metal 54. To expose second metal 54 for later removal, embodiments of the present disclosure can include planarizing insulating layer 62 and third metal 60 to remove upper portion 60b of third metal 60 and expose the upper surface of second metal 54. As shown in FIG. 10, removing upper portion 60b of third metal 60 can yield a pair of unitary metal fins 70, which can be structurally separated and electrically isolated from each other in subsequent process steps.

Figure 11:
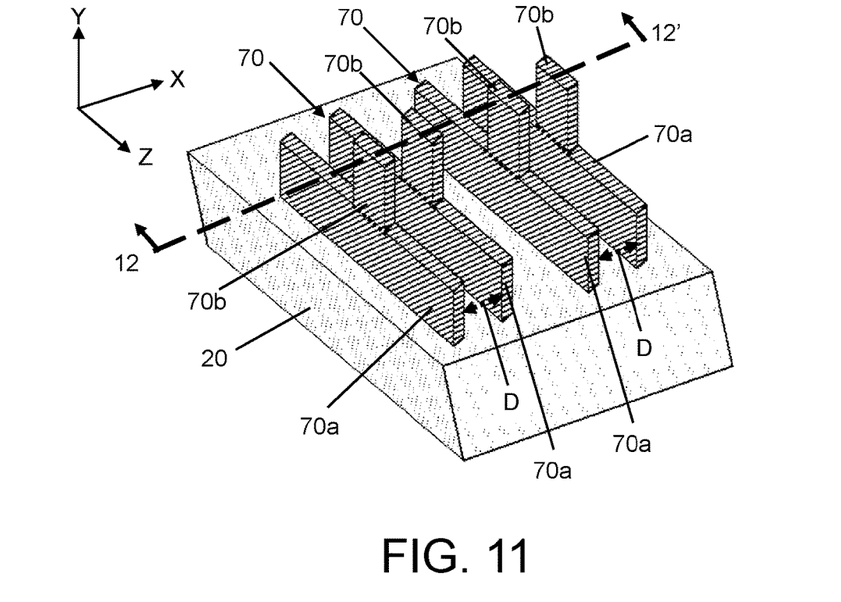
FIG. 11 shows a perspective view of two unitary metal fins positioned on a substrate according to embodiments of the present disclosure.

Turning to FIG. 11, methods according to the present disclosure can include removing other materials such that unitary metal fins 70 remain positioned and freestanding on substrate 20 and laterally separated from each other. To form unitary metal fins 70, mask 34 initially can be removed, e.g., with a liquid or gaseous etchant selective to the material composition of mask 34 (FIGS. 1-3, 5-8), e.g., carbon fluoride ($C_2F_6$), fluoroform ($CHF_3$), hydrogen bromide (HBr), chlorine ($Cl_2$), sulfur hexafluoride ($SF_6$), and/or other etchants selective to nitrides and/or other hard mask materials. In addition, first and second metals 32, 54 (FIGS. 1-10) can be removed, e.g., with hydrogen fluoride (HF), nitric acid ($HNO_3$), hydrochloric acid (HCl), and/or other dry or gaseous etchants selective to tungsten (W). Planarizing insulating layer 62 on substrate 20 can also be removed by application of etchant(s) selective to the material composition thereof, e.g., oxide compounds, polysilicon, etc. It is also understood that a combination of selective and non-selective etchants can be used to remove first and second metals 32, 54, mask 34, and insulating layer 40 in embodiments of the present disclosure. The selective removing can yield pairs of unitary metal fins 70 positioned on substrate 20. Each pair of unitary metal fins 70 can be separated by a distance D of, e.g., between approximately five nanometers (nm) and approximately twenty nanometers. This magnitude of separation distance D between unitary metal fins 70 can provide a reduced pitch (e.g., between approximately ten nm and approximately forty nm) between conductive metals in a resulting IC structure as compared to conventional processes. As shown in FIG. 11, each unitary metal fin 70 formed in processes of the present disclosure can define, e.g., an inverted T-shape on substrate 20.

Figure 12:
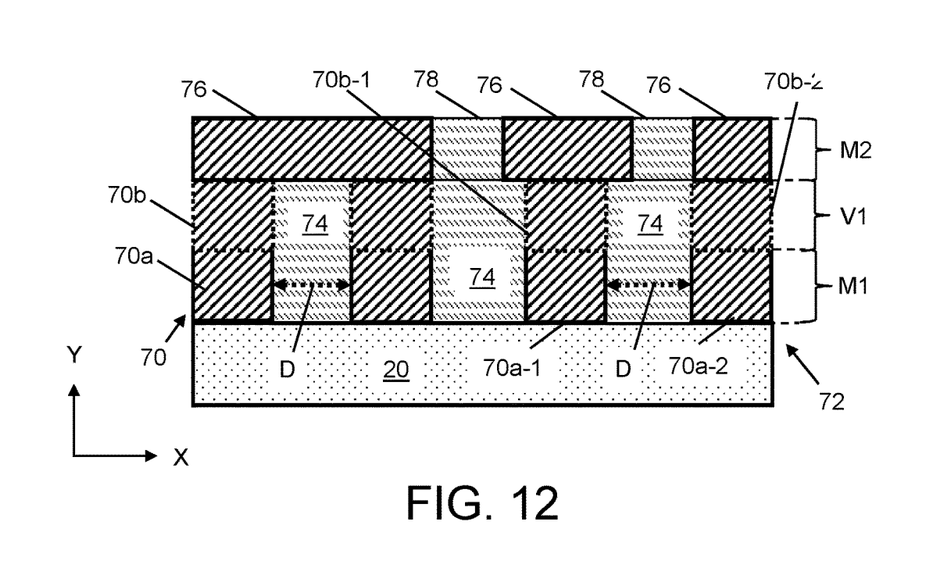
FIG. 12 shows a cross-sectional view of an IC structure including two unitary metal fins according to embodiments of the present disclosure.

Turning to FIG. 12, a cross-sectional view along line 12-12' (FIG. 11) of IC structure 72 according to embodiments of the present disclosure is shown in plane X-Y. IC structure 72 can include additional materials formed on substrate 20 and other components after unitary metal fins 70 are formed in other process steps. In particular, embodiments of the present disclosure can include forming an insulator 74 on substrate 20 and between laterally adjacent conductive metal fins through existing methods, such as flowable chemical vapor deposition and subsequently polishing said insulator 74 back to the top of the metal fins 70, thereby providing structural support and electrical insulation between laterally separated unitary metal fins 70. Insulator 74 can include one or more of the example materials described elsewhere herein for the composition of insulating layer 40 (FIGS. 2-4). Insulator 74 can be planarized after being formed such that an upper surface of insulator 74 is substantially coplanar with an upper surface of unitary metal fins 70. Each unitary metal fin 70 can include, e.g., an elongated wire 70a positioned directly on substrate 20 and a via 70b positioned directly on elongated wire 70a of metal fin(s) 70. Where unitary metal fins 70 are formed in pairs as discussed above, one unitary metal fin 70 can be defined to have a first elongated wire 70a-1 and first via 70b-1, with its corresponding pair being defined to have a second elongated wire 70b-2 and second via 70b-2. Via 70b is depicted in phantom to illustrate that a length dimension of via 70b along Z-axis (i.e., into and out of the page) is less than a lateral length of metal wire 70a along Z-axis, defining an inverted T-shape. Wire and via portions 70a, 70b of metal fin(s) 70 can be a unitary structure as a result of being formed in a single selective epitaxial step, and thus can have a single crystallographic orientation therein.

A group of metal wires 76 can be formed on unitary metal fins 70, e.g., by repeating embodiments of the processes described elsewhere herein or performing different conventional process steps of forming a metal wire on a structure. Lateral insulators 78 can be formed to separate metal wires 76 from each other in IC structure 72, and may include the same material composition as insulator 74 and/or may be formed of other electrically insulative materials. Elongated wire 70a of unitary metal fin(s) 70 can define a first metal level M1 in IC structure 72, while via 70b of the same unitary metal fin(s) 70 can define a via layer V1 positioned on first metal level M1. Metal wires 76 positioned over and contacting unitary metal fins 70 can define a second metal level M2. The processes discussed herein can cause each unitary metal fin 70 to be a unitary structure positioned partially in first metal level M1 and partially in first via layer V1.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product.

The terminology used herein is for the purpose of describing particular embodiments only and is not intended to be limiting of the disclosure. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about," "approximately" and "substantially," are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A method of forming an integrated circuit (IC) structure, the method comprising:
   providing a freestanding dummy structure positioned on a substrate, the freestanding dummy structure including: a first metal positioned on the substrate, and a mask positioned on the first metal;
   forming an insulating layer on the substrate, wherein the insulating layer laterally abuts the mask of the freestanding dummy structure;
   forming an opening in the mask to expose an upper surface of the first metal;
   forming a second metal on the first metal and within the opening;
   removing the insulating layer to expose a pair of opposing sidewalls of the first and second metals;
   selectively growing a third metal on the exposed pair of opposing sidewalls of the first and second metals, such that the third metal is positioned on the substrate and directly laterally abuts the first and second metals;
   planarizing an upper surface of the third metal to expose the mask and the second metal; and
   removing the first metal, the second metal, and the mask to yield a pair of unitary metal fins positioned on the substrate, wherein each of the pair of unitary metal fins includes a remaining portion of the third metal.

2. The method of claim 1, wherein the each of the pair of unitary metal fins defines an inverted T-shape positioned on the substrate.

3. The method of claim 1, wherein the remaining portion of the third metal in each of the pair of unitary metal fins includes a single crystallographic orientation.

4. The method of claim 1, wherein the mask of the freestanding dummy structure includes a material contains silicon and nitrogen, and wherein the forming of the opening in the mask includes etching the mask with a selective etchant without etching the first metal and the insulating layer.

5. The method of claim 1, wherein the insulating layer comprises one of silicon oxide and amorphous silicon.

6. The method of claim 1, wherein a material composition of each of the first and second metals comprise one of tungsten (W), cobalt (Co), or Nickel (Ni).

7. The method of claim 6, wherein the forming of the second metal includes selectively depositing the material composition of the second metal on the exposed upper surface of the first metal with one of a chemical vapor deposition (CVD) or an electroless deposition.

8. The method of claim 1, wherein the third metal includes one of copper (Cu), ruthenium (Ru), cobalt (Co), molybdenum (Mo), iridium (Ir), osmium (Os), niobium (Nb) and nickel (Ni).

9. The method of claim 1, wherein a material composition of the third metal is different from a material composition of the first and second metals.

10. The method of claim 1, wherein a lateral separation distance between the first and second unitary metal fins is between approximately five nanometers (nm) and approximately twenty nm.

11. A method of forming a set of wires and contacts for an integrated circuit (IC), the method comprising:
    providing a freestanding dummy structure positioned on a substrate, the freestanding dummy structure including: a first metal positioned on the substrate, and a mask positioned on the first metal, wherein the first metal comprises tungsten (W);
    forming an insulating layer on the substrate, wherein the insulating layer laterally abuts the mask;
    forming an opening in the mask to expose an upper surface of the first metal;
    epitaxially growing a second metal selectively on the first metal and within the opening, wherein the second metal comprises tungsten (W);
    removing the insulating layer to expose a pair of opposing sidewalls of the first and second metals;
    selectively growing a third metal on the exposed pair of opposing sidewalls of the first and second metals, such that the third metal is positioned on the substrate and laterally abuts the first and second metals;
    planarizing an upper surface of the third metal to expose the mask and the second metal; and
    removing the first metal, the second metal, and the mask to yield a pair of unitary metal fins positioned on the substrate, wherein each of the pair of unitary metal fins includes a remaining portion of the third metal.

12. The method of claim 11, wherein the each of the pair of unitary metal fins defines an inverted T-shape positioned on the substrate.

13. The method of claim 11, wherein a material composition the third metal includes one of copper (Cu), ruthenium (Ru), cobalt (Co), molybdenum (Mo), iridium (Ir), osmium (Os), niobium (Nb) and nickel (Ni).

14. The method of claim 11, wherein a height of the first metal of the dummy structure defines a first metal level of the IC, and wherein a height of the mask of the dummy structure defines a first via layer of the IC.

15. The method of claim 11, wherein the mask of the freestanding dummy structure includes silicon and nitrogen, and wherein the forming of the opening in the mask includes etching the mask with a selective etchant without etching the first metal and the insulating layer.

16. The method of claim 11, wherein a material composition of the third metal is different from a material composition of the first and second metals.

17. The method of claim 11, wherein a lateral separation distance between the first and second unitary metal fins is between approximately five nanometers (nm) and approximately twenty nm.

18. An integrated circuit (IC) structure comprising:
    a first unitary metal fin positioned on a substrate and including a first elongated wire positioned on the substrate and a first via positioned directly on a portion of the first elongated wire, the first elongated wire and the first via of the first unitary metal fin defining an inverted T-shape, wherein the first elongated wire includes a pair of opposing sidewalls substantially coplanar with a pair of opposing sidewalls of the first via, and wherein the first unitary metal fin includes a single crystallographic orientation;

a second unitary metal fin positioned on the substrate and including a second elongated wire positioned on the substrate and a second via positioned directly on a portion of the second elongated wire, the second elongated wire and the second via of the second unitary metal fin defining an inverted T-shape, wherein the second elongated wire includes a pair of opposing sidewalls substantially coplanar with a pair of opposing sidewalls of the second via, and wherein the second unitary metal fin includes a single crystallographic orientation; and an insulator positioned directly laterally between the first unitary metal fin and the second unitary metal fin, wherein a lateral width of the insulator between the first and second unitary metal fins is between approximately five nanometers (nm) and approximately twenty nm.

19. The IC structure of claim 18, wherein the first and second unitary metal fins each include one of copper (Cu), ruthenium (Ru), cobalt (Co), molybdenum (Mo), iridium (Ir), osmium (Os), niobium (Nb) and nickel (Ni).

20. The IC structure of claim 18, wherein an upper surface of the insulator is substantially coplanar with an upper surface of the first and second vias of the first and second unitary metal fins.

* * * * *